(12) United States Patent
Wu et al.

(10) Patent No.: US 9,893,185 B2
(45) Date of Patent: Feb. 13, 2018

(54) FIN FIELD EFFECT TRANSISTOR AND METHOD FOR FABRICATING THE SAME

(71) Applicant: Taiwan Semiconductor Manufacturing Co., Ltd., Hsinchu (TW)

(72) Inventors: Cheng-Ta Wu, Chiayi County (TW); Yu-Ting Lin, Tainan (TW); Po-Kai Hsiao, Changhua County (TW); Po-Kang Ho, Taoyuan (TW); Ting-Chun Wang, Tainan (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 15/054,133

(22) Filed: Feb. 26, 2016

(65) Prior Publication Data

US 2017/0250282 A1    Aug. 31, 2017

(51) Int. Cl.
H01L 29/76 (2006.01)
H01L 29/78 (2006.01)
H01L 27/088 (2006.01)
H01L 21/8234 (2006.01)

(52) U.S. Cl.
CPC .. *H01L 29/7848* (2013.01); *H01L 21/823431* (2013.01); *H01L 21/823468* (2013.01); *H01L 21/823481* (2013.01); *H01L 27/0886* (2013.01)

(58) Field of Classification Search
CPC .......... H01L 29/785–29/7856; H01L 27/0886; H01L 21/823431; H01L 21/823468; H01L 21/823481; H01L 27/1211; H01L 21/823821; H01L 21/845; H01L 29/41791; H01L 29/7851
USPC ........ 438/152, 153, 154, 218; 257/192, 401, 257/408, 369, 350
See application file for complete search history.

(56) References Cited

U.S. PATENT DOCUMENTS

| | | | |
|---|---|---|---|
| 2012/0138897 A1* | 6/2012 | Lin | H01L 21/02381 257/19 |
| 2013/0248999 A1* | 9/2013 | Glass | H01L 29/36 257/335 |
| 2015/0097244 A1* | 4/2015 | Liu | H01L 27/1211 257/351 |
| 2015/0200252 A1* | 7/2015 | Ching | H01L 29/0649 257/510 |
| 2016/0181161 A1* | 6/2016 | Song | H01L 29/66803 257/345 |
| 2016/0204105 A1* | 7/2016 | Zeng | H01L 21/823807 257/401 |

(Continued)

*Primary Examiner* — Kevin M Picardat
(74) *Attorney, Agent, or Firm* — JCIPRNET

(57) ABSTRACT

A FinFET including a substrate, a plurality of isolation structures, a plurality of blocking layers, and a gate stack is provided. The substrate has a plurality of semiconductor fins. The isolation structures are located on the substrate to isolate the semiconductor fins. In addition, the semiconductor fins protrude from the isolation structures. The blocking layers are located between the isolation structures and the semiconductor fins. The material of the blocking layers is different from the material of the isolation structures. The gate stack is disposed across portions of the semiconductor fins, portions of the blocking layers and portions of the isolation structures. In addition, a method for fabricating the FinFET is also provided.

17 Claims, 14 Drawing Sheets

(56) References Cited

U.S. PATENT DOCUMENTS

2016/0204260 A1* 7/2016 Ching ................ H01L 29/7851
   257/401

* cited by examiner

FIN FIELD EFFECT TRANSISTOR AND METHOD FOR FABRICATING THE SAME

BACKGROUND

As the semiconductor devices keep scaling down in size, three-dimensional multi-gate structures, such as the fin-type field effect transistor (FinFET), have been developed to replace planar Complementary Metal Oxide Semiconductor (CMOS) devices. A structural feature of the FinFET is the silicon-based fin that extends upright from the surface of the substrate, and the gate wrapping around the conducting channel that is formed by the fin further provides a better electrical control over the channel.

During fabrication of the FinFET, the fin profile is very critical for process window. The current FinFET fabricating process may suffer from a loading effect and a fin-bending issue.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
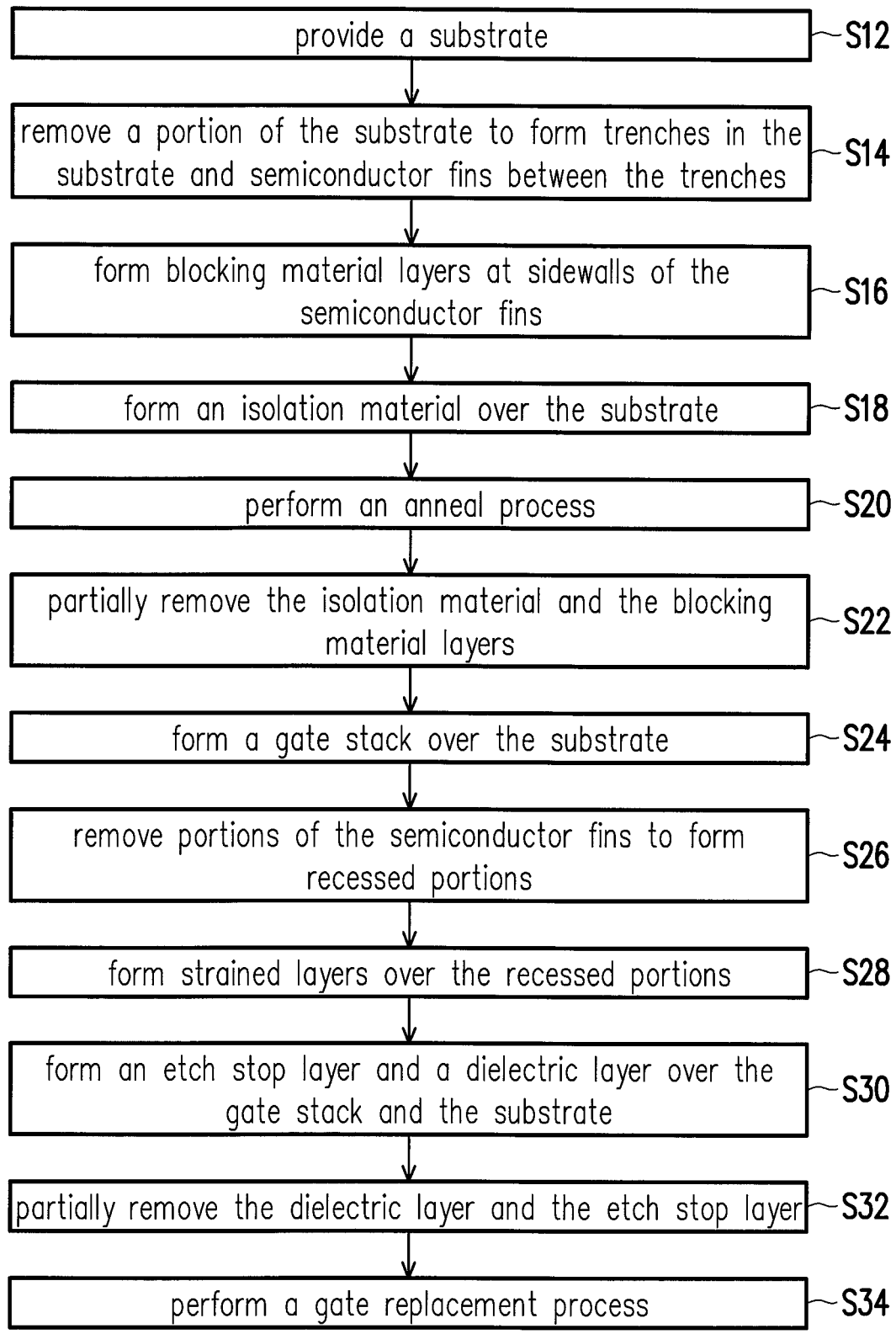
FIG. 1 is a flow chart illustrating a method for fabricating a FinFET in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a flow chart illustrating a method for fabricating a FinFET in accordance with some embodiments. FIGS. 2A to 2M are perspective views of a method for fabricating FinFET in accordance with some embodiments. FIGS. 3A to 3G are cross-sectional views of the FinFET taken along the line I-I' of FIG. 2A to 2G. FIGS. 3H to 3I are cross-sectional views of the FinFET taken along the line II-II' of FIG. 2H to 2I. FIGS. 3J to 3M are cross-sectional views of the FinFET taken along the line III-III' of FIG. 2J to 2M.

Figure 2A:
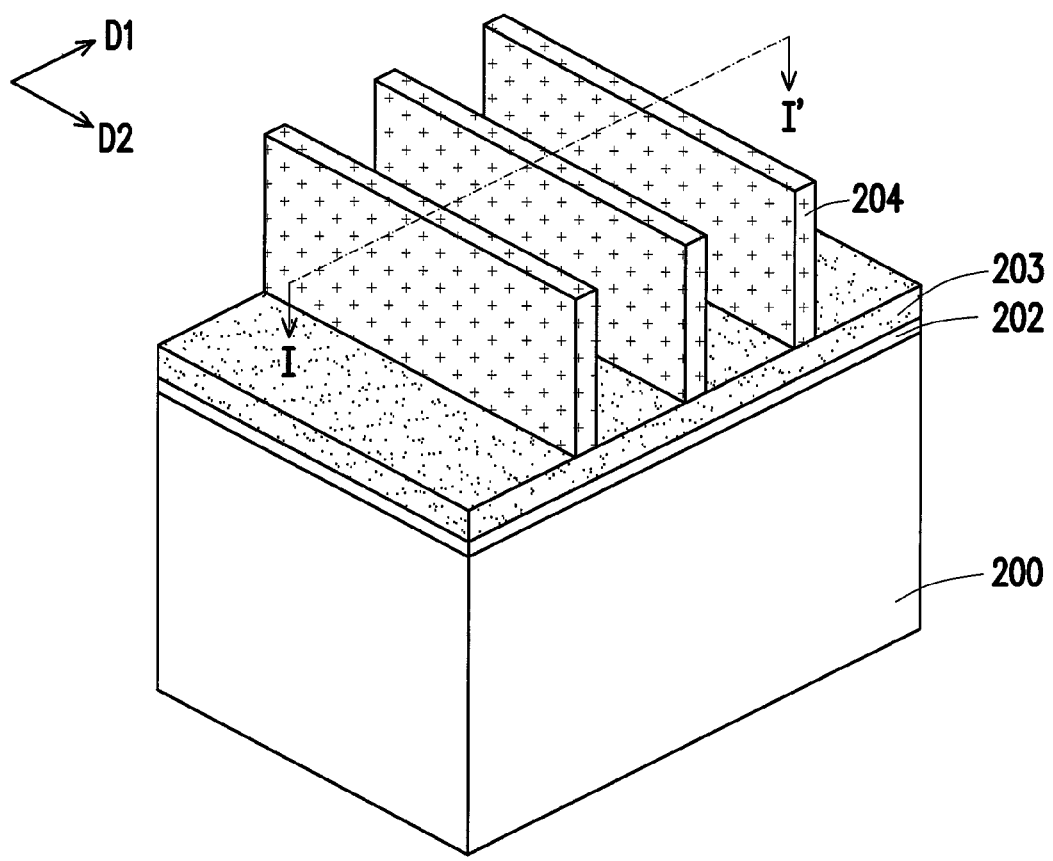
FIGS. 2A to 2M are perspective views of a method for fabricating a FinFET in accordance with some embodiments.
Figure 3A:
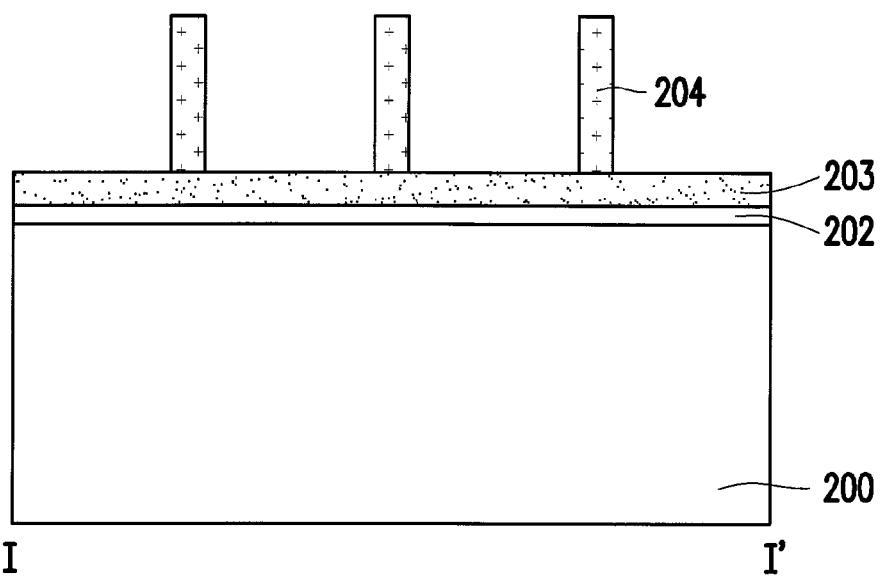
FIGS. 3A to 3G are cross-sectional views of the FinFET taken along the line I-I' of FIG. 2A to 2G.
Figure 3B:
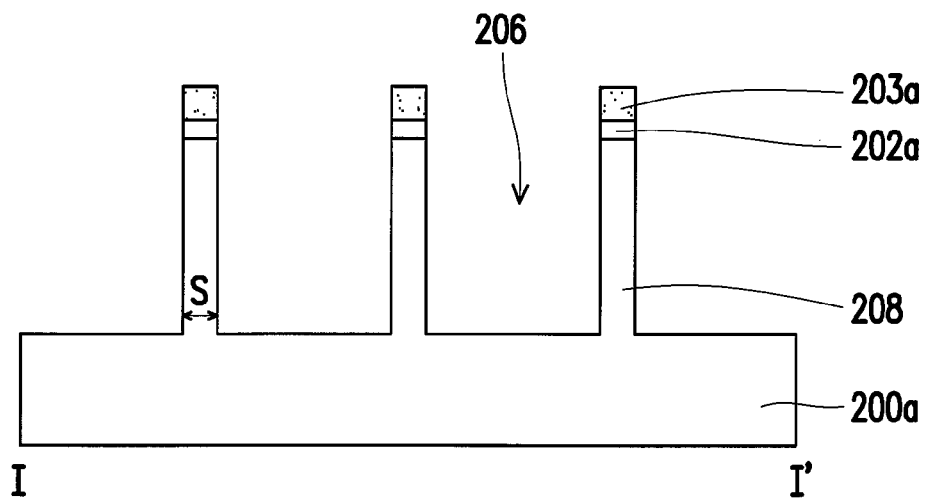
Figure 3C:
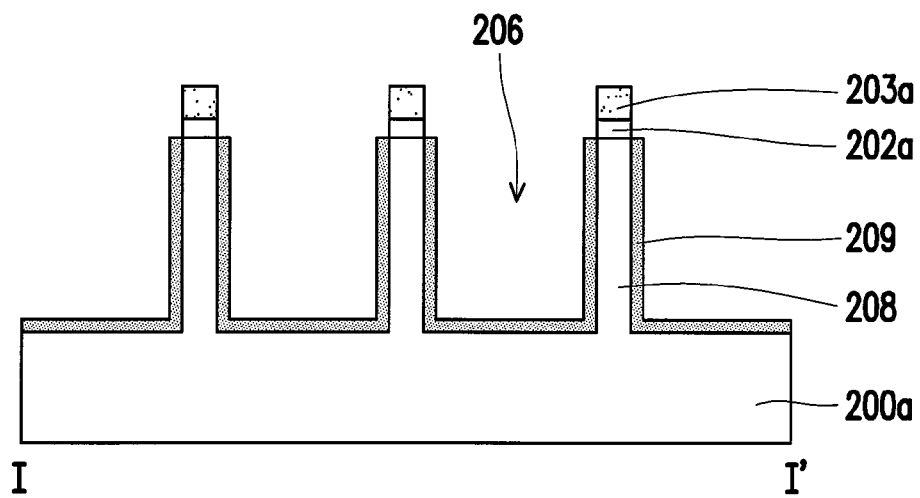
Figure 3D:
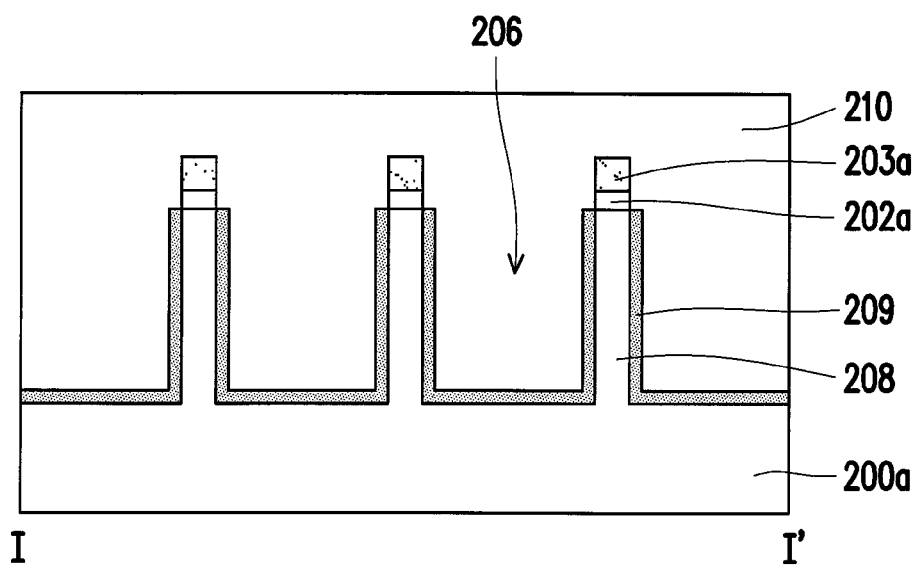

In Step 12 in FIG. 1 and as shown in FIG. 2A and FIG. 3A, a substrate 200 is provided. The substrate 200 includes a bulk substrate, a silicon-on-insulator (SOI) substrate or a germanium-on-insulator (GOI) substrate, for example. In one embodiment, the substrate 200 includes a crystalline silicon substrate (e.g., wafer). The substrate 200 may include various doped regions depending on design requirements (e.g., p-type substrate or n-type substrate). In some embodiments, the doped regions may be doped with p-type or n-type dopants. For example, the doped regions may be doped with p-type dopants, such as boron or $BF_2^+$; n-type dopants, such as phosphorus or arsenic; and/or a combination thereof. The doped regions may be configured for an n-type FinFET, or alternatively configured for a p-type FinFET. In some alternative embodiments, the substrate 200 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Also, in some embodiments, the substrate may include other conductive layers or other semiconductor elements, such as transistors, diodes or the like.

In one embodiment, a pad layer 202 and a mask layer 203 are sequentially formed on the substrate 200. The pad layer 202 may be a silicon oxide thin film formed, for example, by performing a thermal oxidation process. The pad layer 202 may act as an adhesion layer between the substrate 200 and mask layer 203. The pad layer 202 may also act as an etch stop layer for etching the mask layer 203. In at least one embodiment, the mask layer 203 is a silicon nitride layer formed, for example, by performing a low-pressure chemical vapor deposition (LPCVD) process or a plasma enhanced chemical vapor deposition (PECVD) process. The mask layer 203 is used as a hard mask during subsequent photolithography processes. A patterned photoresist layer 204 having a predetermined pattern is formed on the mask layer 203.

In Step S14 in FIG. 1 and as shown in FIGS. 2A to 2B and FIGS. 3A to 3B, the mask layer 203 and the pad layer 202 which are not covered by the patterned photoresist layer 204 are sequentially etched to form a patterned mask layer 203a and a patterned pad layer 202a so as to expose the underlying substrate 200. By using the patterned photoresist layer 204 as a mask, portions of the substrate 200 are exposed and etched to form trenches 206 and semiconductor fins 208. The semiconductor fins 208 are covered by the patterned mask layer 203a, the patterned pad layer 202a and the patterned photoresist layer 204. Two adjacent trenches 206 are spaced apart by a spacing S. For example, the spacing S between the trenches 206 may be smaller than about 30 nm. In other words, two adjacent trenches 206 are spaced apart by a corresponding semiconductor fin 208.

The height of the semiconductor fins 208 and the depth of the trench 206 range from about 5 nm to about 500 nm. After the trenches 206 and the semiconductor fins 208 are formed, the patterned photoresist layer 204 is then removed. In one embodiment, a cleaning process may be performed to remove a native oxide of the semiconductor substrate 200a and the semiconductor fins 208. The cleaning process may be performed using diluted hydrofluoric (DHF) acid or other suitable cleaning solutions.

In Step S16 and Step S18 in FIG. 1 and as shown in FIGS. 2B to 2D and FIGS. 3B to 3D, blocking material layers 209 are formed over the substrate 200a to cover sidewalls of the semiconductor fins 208 and bottom surfaces of the trenches 206. An insulating material 210 is formed over the substrate 200a to cover the blocking material layers 209, the patterned pad layer 202a and the patterned mask layer 203a, and fill up the trenches 206.

The blocking material layers 209 include dielectric materials. The dielectric materials include oxide. In some embodiments, the content of oxygen of the blocking material layers 209 is larger than the content of oxygen of the insulating material 210. In some exemplary embodiments, the blocking material layers 209 include oxygen-rich oxide such as an oxygen-rich semiconductor oxide. The oxygen-rich semiconductor oxide includes oxygen-rich silicon oxide, silicon-germanium oxide or a combination thereof, for example. In some embodiments, the oxygen-rich oxide is represented by $MO_x$, where M is Si or Ge, and $2.1 \leq x \leq 2.5$. In alternative embodiments, the blocking material layers 209 include negative-charged layers. The surface charges of the negative-charged layers range from $-20 \times 10^{10}/cm^2$ to $-150 \times 10^{10}/cm^2$. In alternative embodiments, the blocking material layers 209 and the insulating material 210 are oxides of silicon, and the binding energy value of Si—O of the blocking material layers 209 is smaller than the boning energy value of Si—O of the insulating material 210. At least one of the blocking material layers 209 includes a single layer or multi-layered structure. The thickness of the blocking material layers 209 ranges from about 1 nm to about 50 nm, for example.

In some embodiments, the blocking material layers 209 are formed by performing an oxidation process. The oxidation process includes a plasma treatment using at least a gas containing oxygen (O), for example. In the oxidation process, the semiconductor fins 208 are oxidized by neutral radicals, ion, electrons or a combination thereof included in the plasma treatment. In some embodiments, the blocking material layers 209 are formed by performing a plasma treatment, and the fabrication parameters for the plasma treatment include an oxygen gas flow rate of about 0.1 slm to 30 slm, a hydrogen gas flow rate of about 0.05 slm to 10 slm, an operating temperature of 25° C. to 600° C. and an operating pressure of 0.5 torr to 200 torr. In alternative embodiments, the blocking material layers 209 are formed by performing a plasma treatment, and the fabrication parameters for the plasma treatment include an oxygen gas and a hydrogen gas, an oxygen gas flow rate of about 0.1 slm to 30 slm, a hydrogen gas flow rate of about 0.05 slm to 10 slm, an operating temperature of 300° C. to 400° C. and an operating pressure of 1 torr to 20 torr.

The material of the insulating material 210 is different from the material of the blocking material layers 209. The insulating material 210 may include silicon oxide, silicon nitride, silicon oxynitride, a spin-on dielectric material, or a low-K dielectric material. It should be noted that the low-k dielectric materials are generally dielectric materials having a dielectric constant lower than 3.9. Examples of low-k dielectric materials includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof.

In some embodiments, the insulating material 210 may include oxide. In some exemplary embodiments, the content of oxygen of the insulating material 210 is smaller than the content of oxygen of the blocking material layers 209. In some exemplary embodiments, the insulating material 210 is represented by $SiO_y$, and $y \leq 2.0$. In alternative embodiments, the blocking material layers 209 include negative-charged layers, whereas the insulating material 210 include positive charged layers. In alternative embodiments, the blocking material layers 209 and the insulating material 210 are oxides of silicon, and the binding energy value of Si—O of the insulating material 210 is larger than the binding energy value of Si—O of the blocking material layers 209. The insulating material 210 may be formed by performing a high-density-plasma chemical vapor deposition (HDP-CVD), a sub-atmospheric CVD (SACVD) process or a spin-on process.

In Step S20 in FIG. 1, in some embodiments, after the insulating material 210 is formed, an anneal process is performed to densify the insulating material 210. The temperature of the anneal process ranges form 200° C. to 1150° C., for example. The semiconductor fins 208 are covered by the blocking material layers 209, and thus the semiconductor fins 208 may be prevented from being oxidized during the anneal process. Therefore, the critical dimension (CD) of the semiconductor fins 208 may be prevented from being reduced after the anneal process is performed.

Figure 2B:
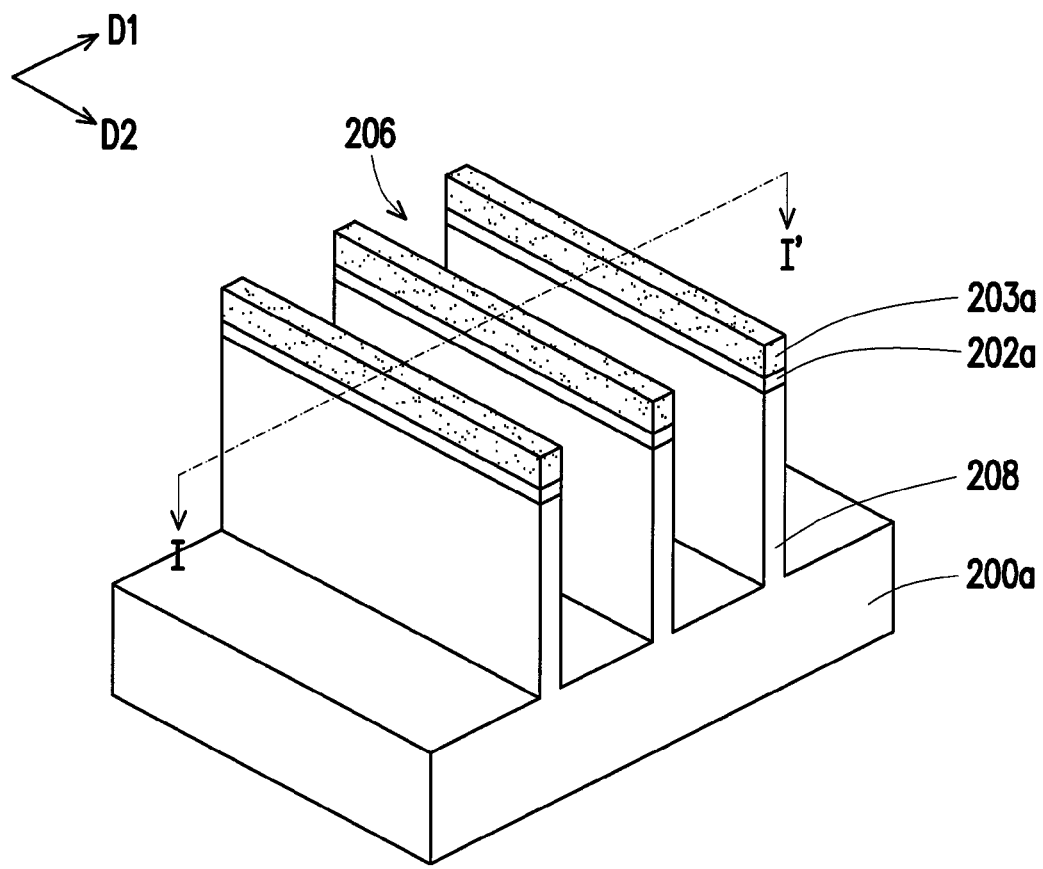
Figure 2C:
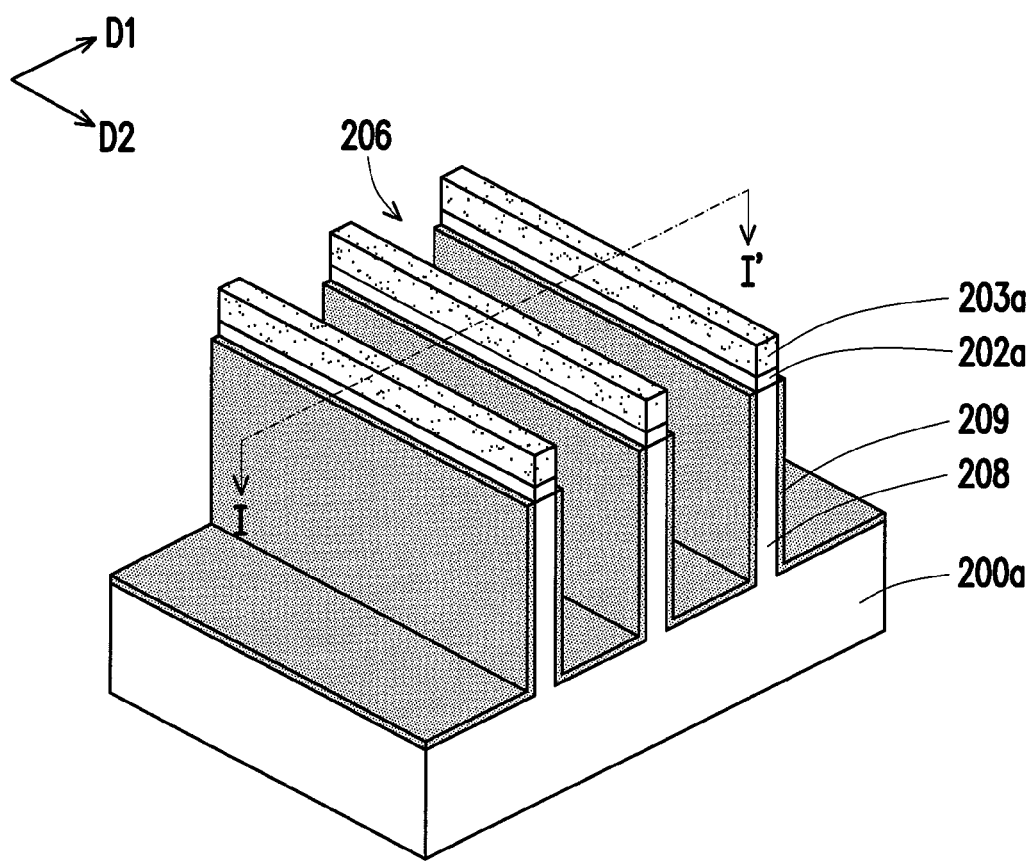
Figure 2D:
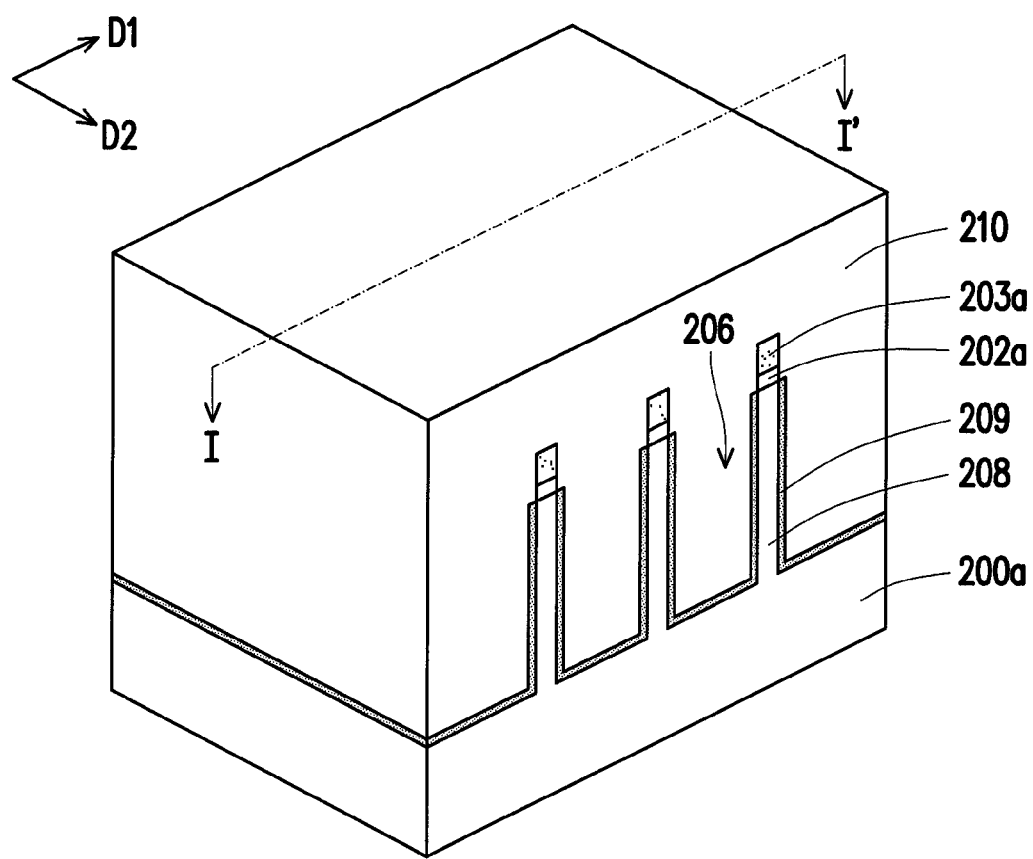
Figure 2E:
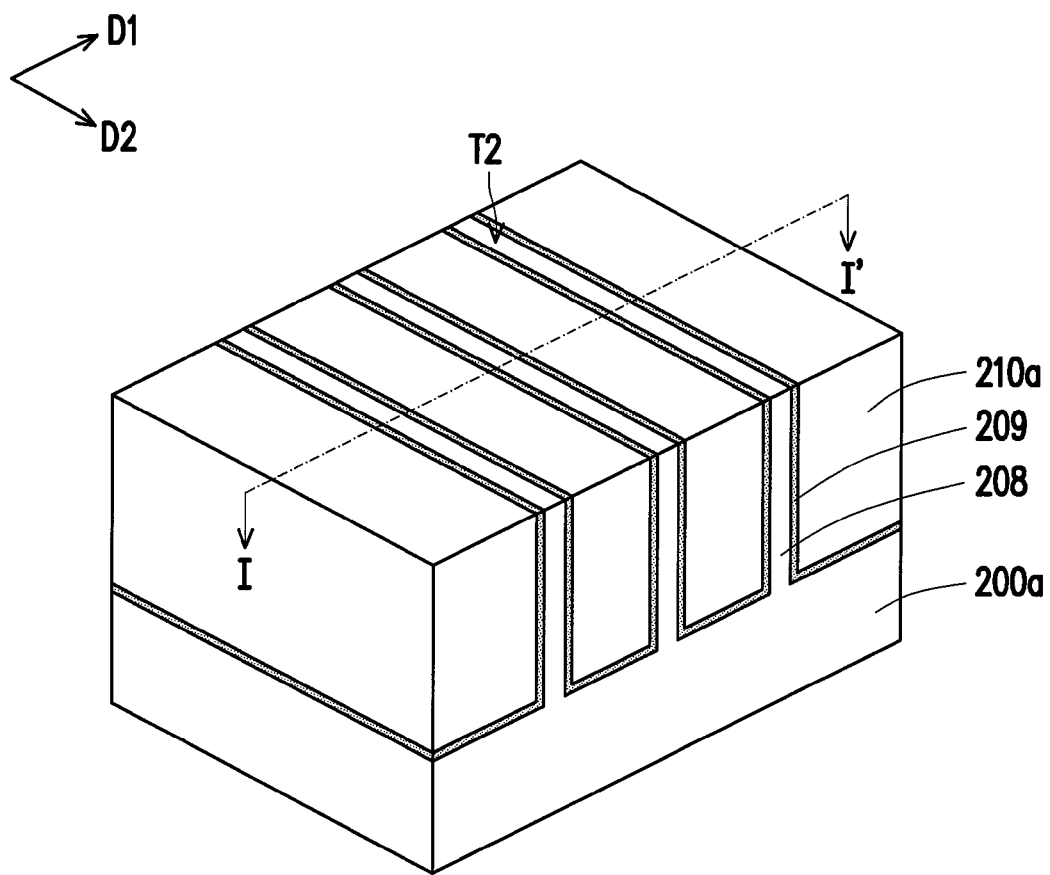
Figure 3E:
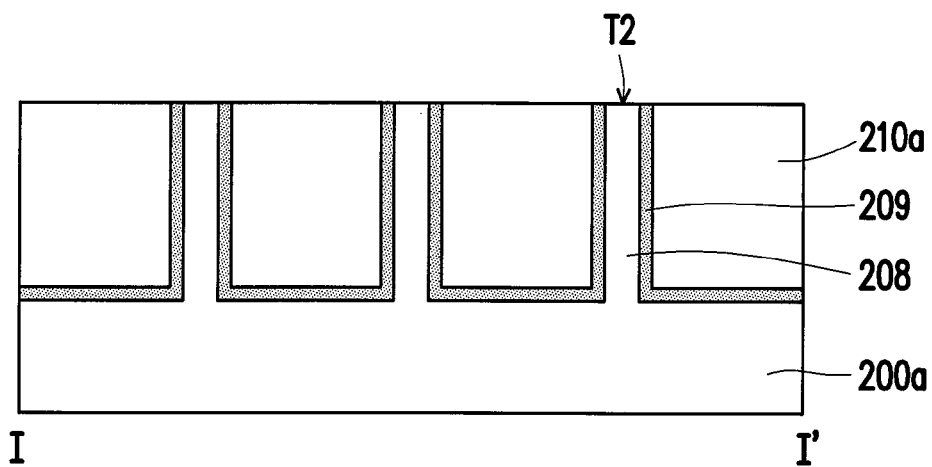
Figure 2F:
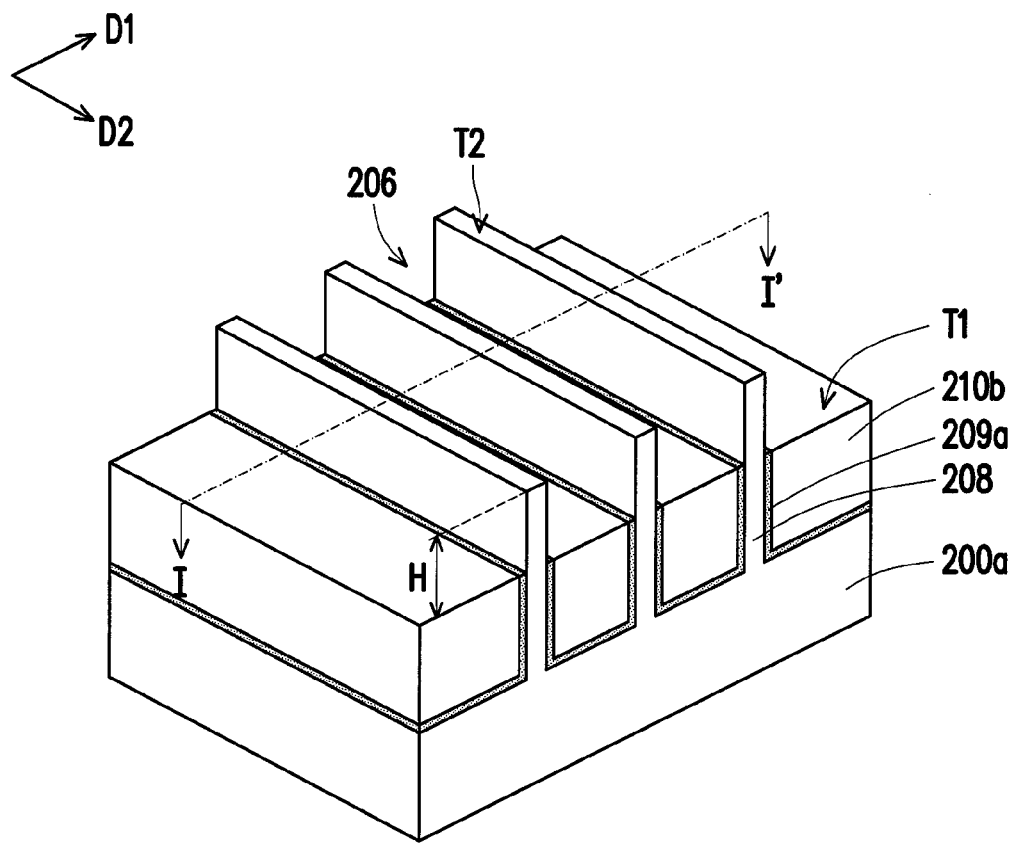
Figure 3F:
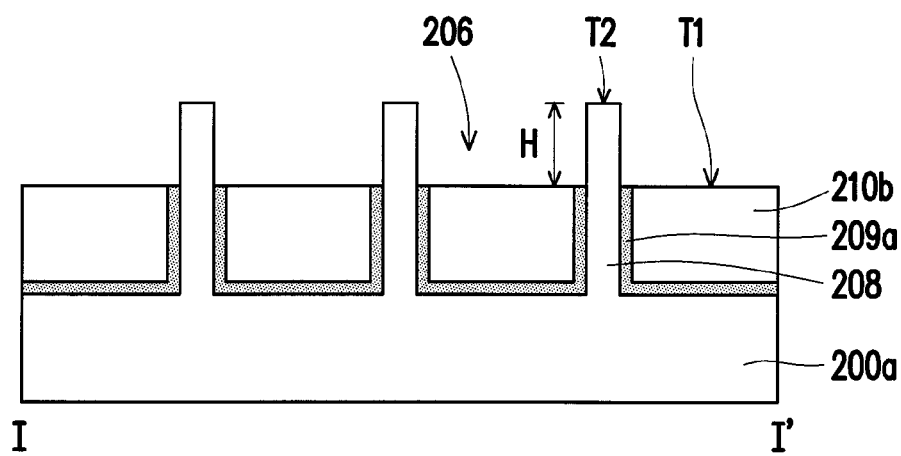
Figure 2G:
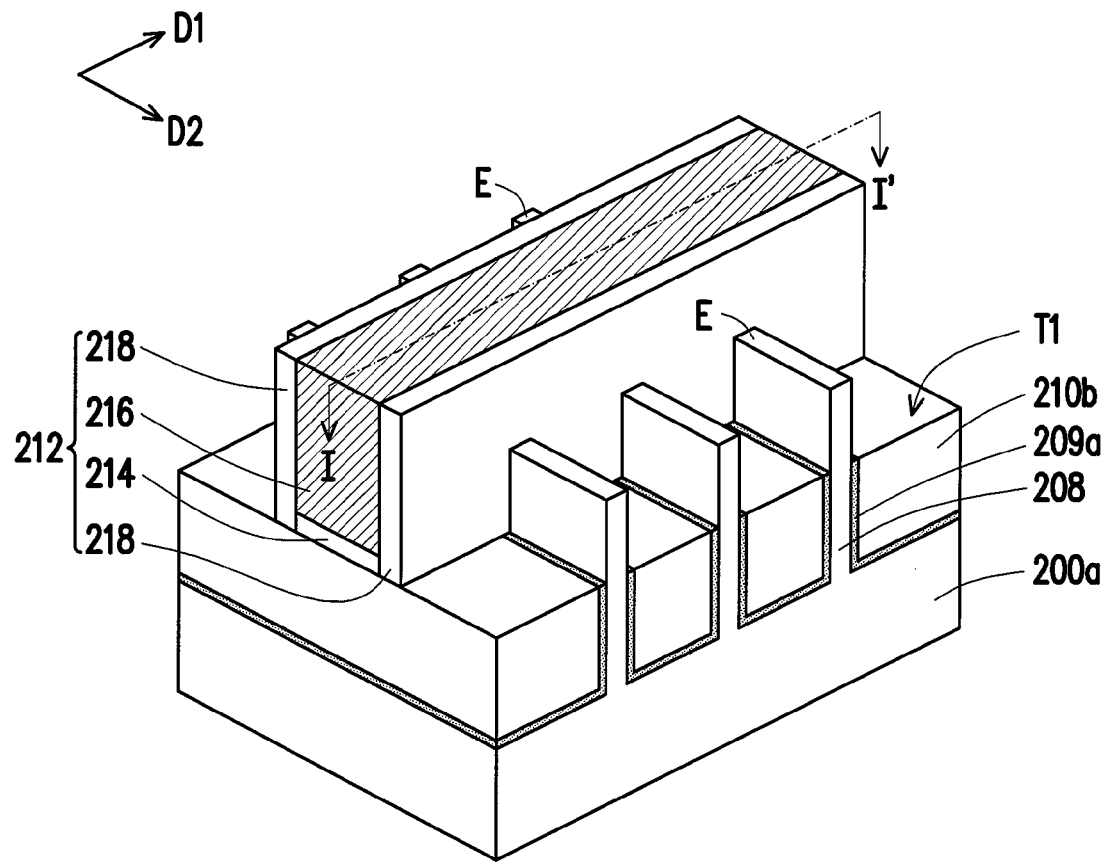
Figure 3G:
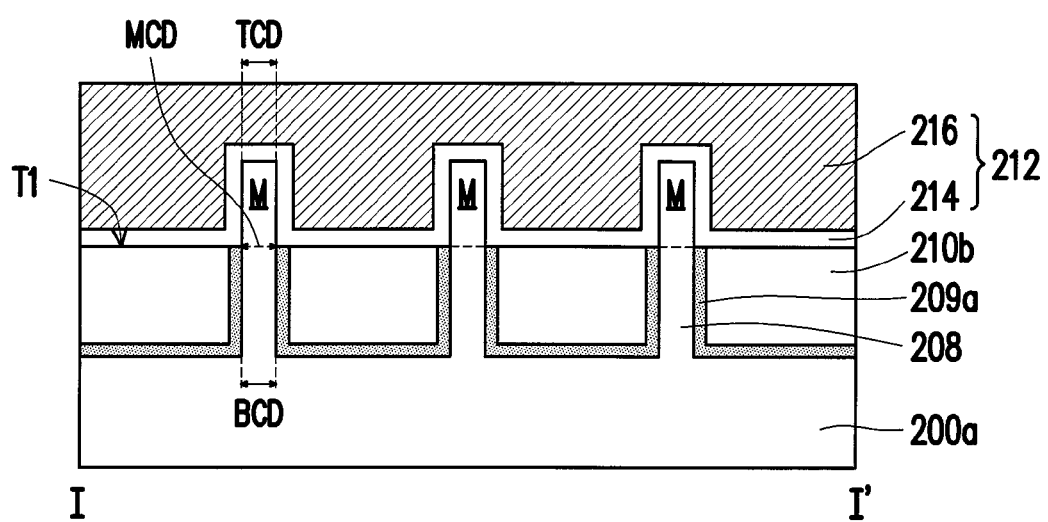
Figure 2H:
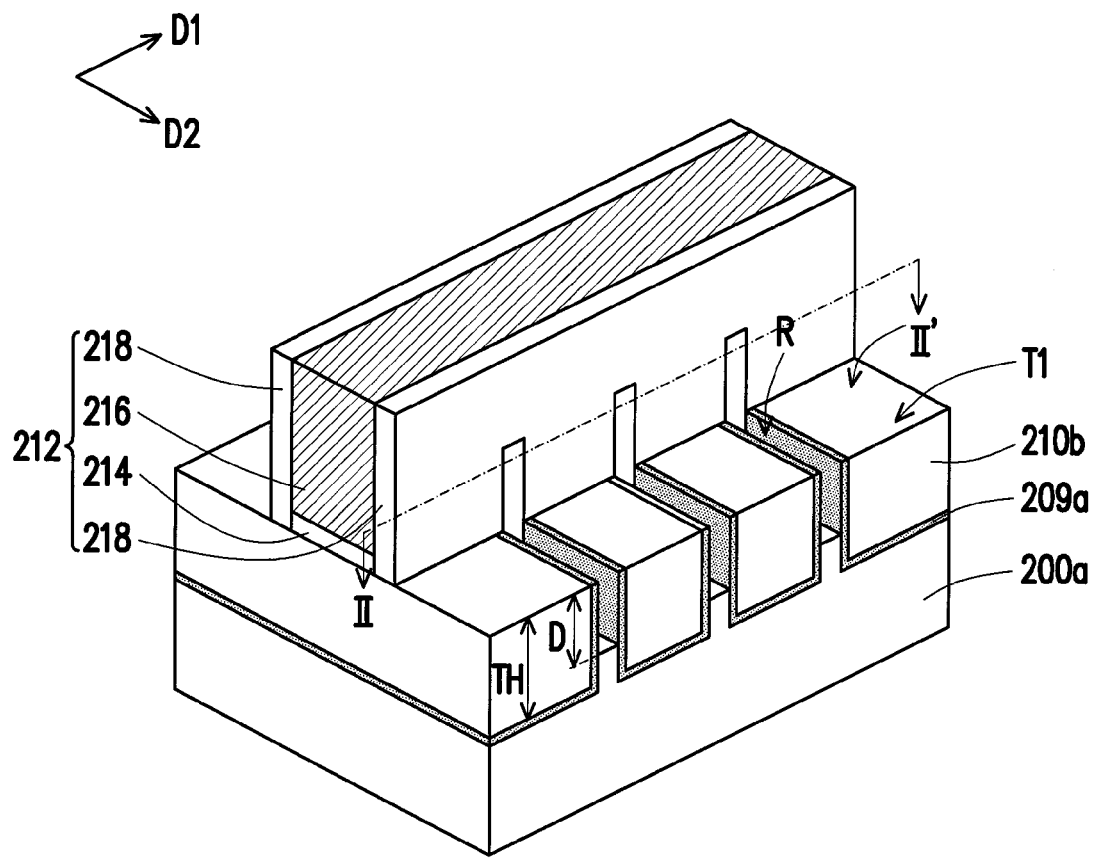
Figure 3H:
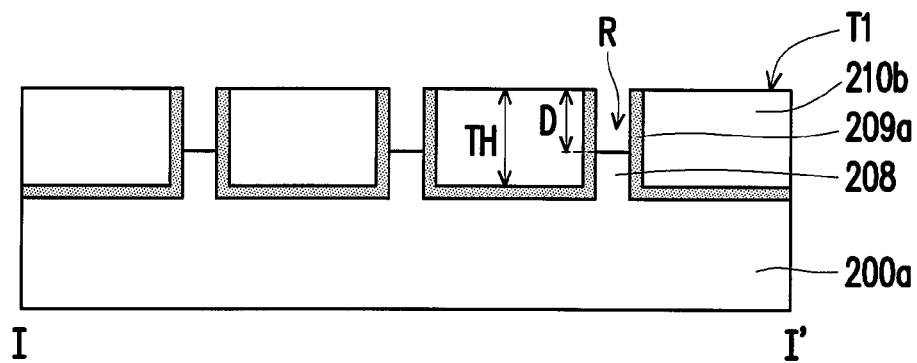
FIGS. 3H to 3I are cross-sectional views of the FinFET taken along the line II-II' of FIG. 2H to 2I.
Figure 2I:
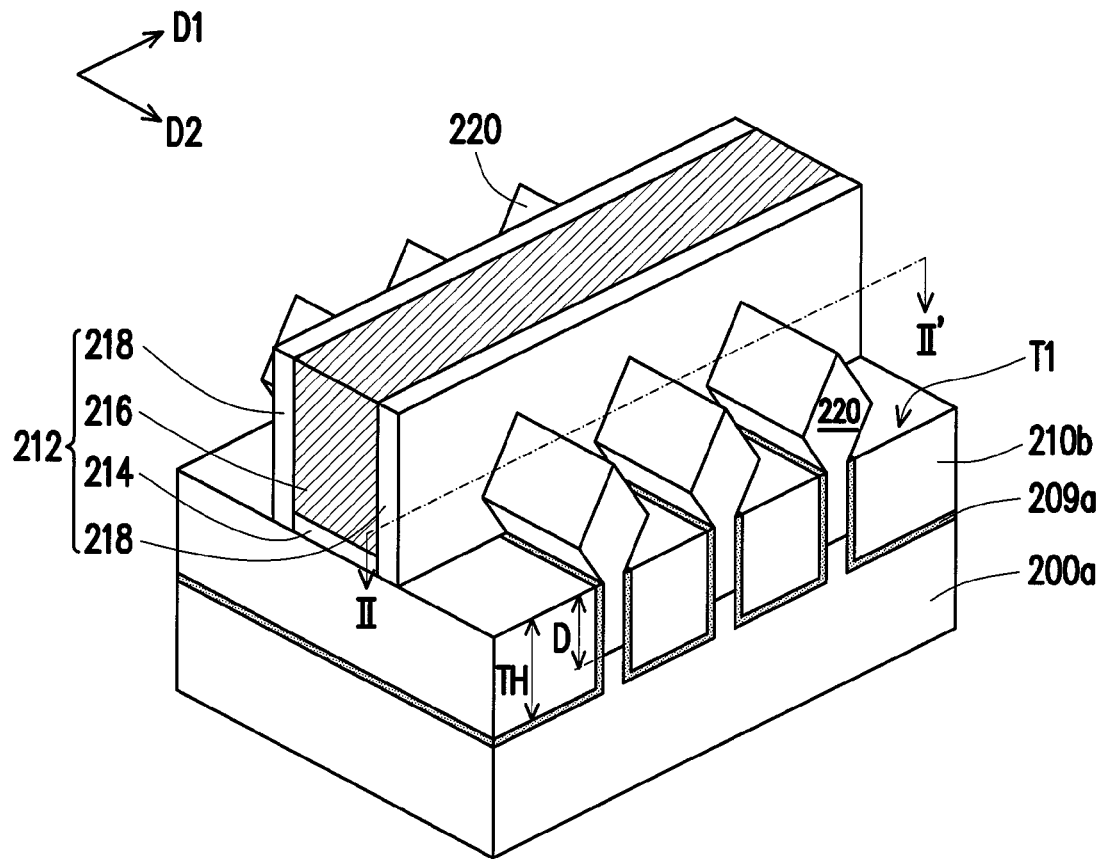
Figure 3I:
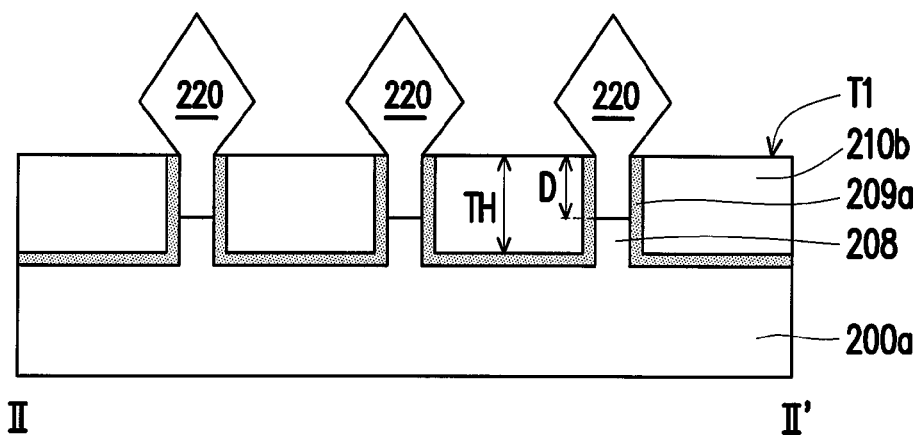
Figure 2J:
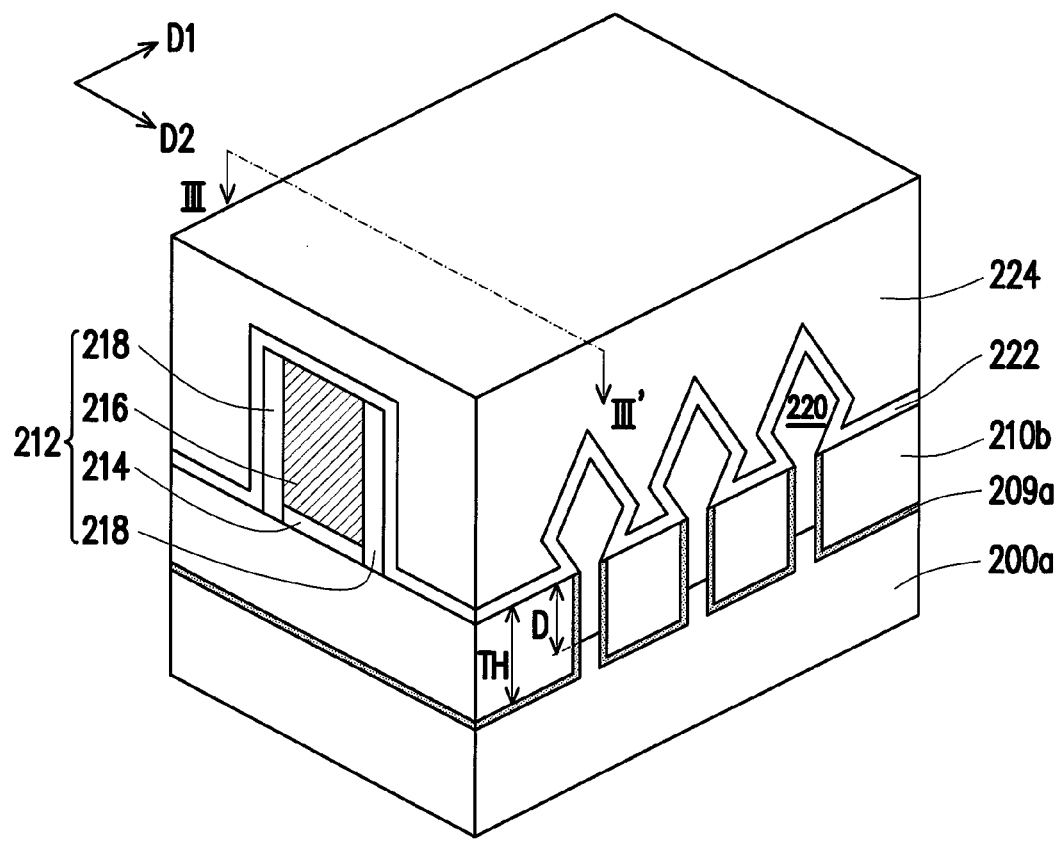
Figure 3J:
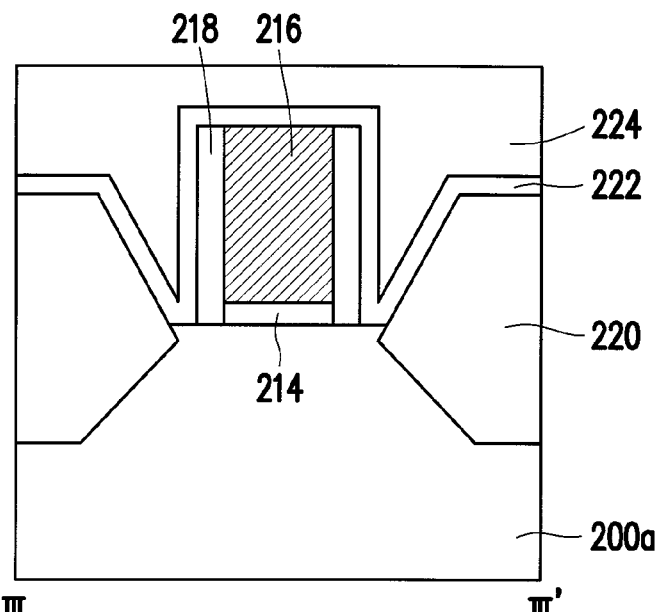
FIGS. 3J to 3M are cross-sectional views of the FinFET taken along the line III-III' of FIG. 2J to 2M.
Figure 2K:
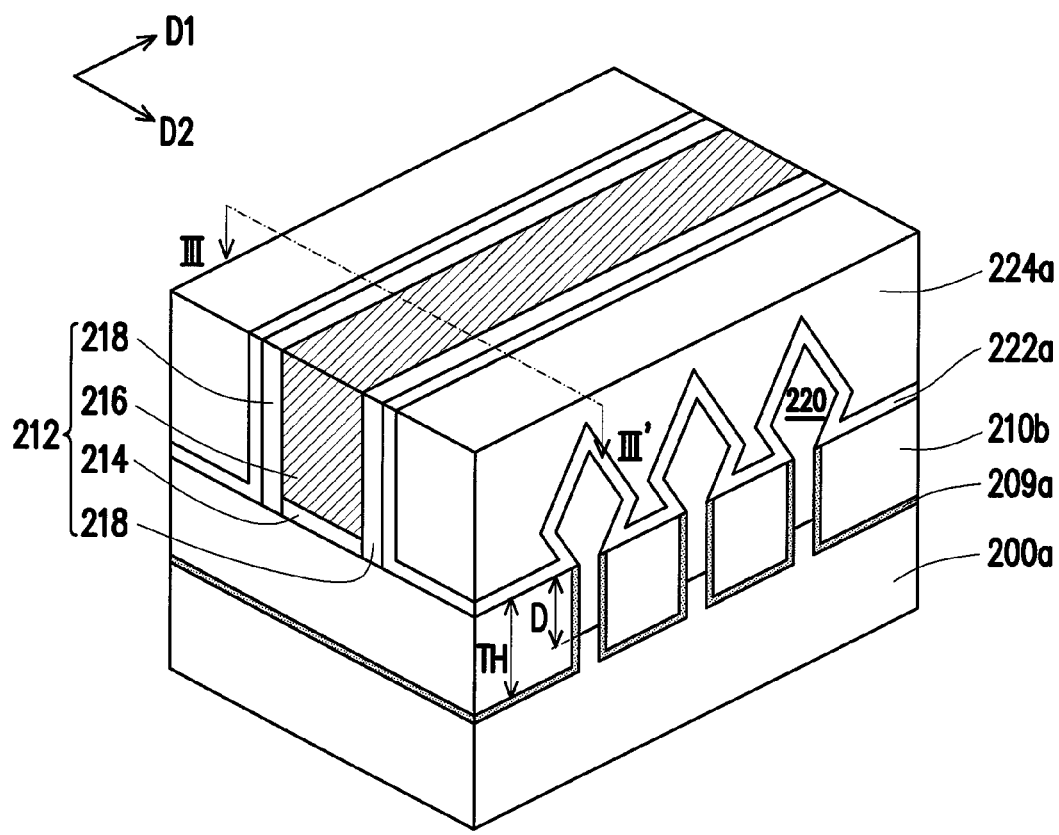
Figure 3K:
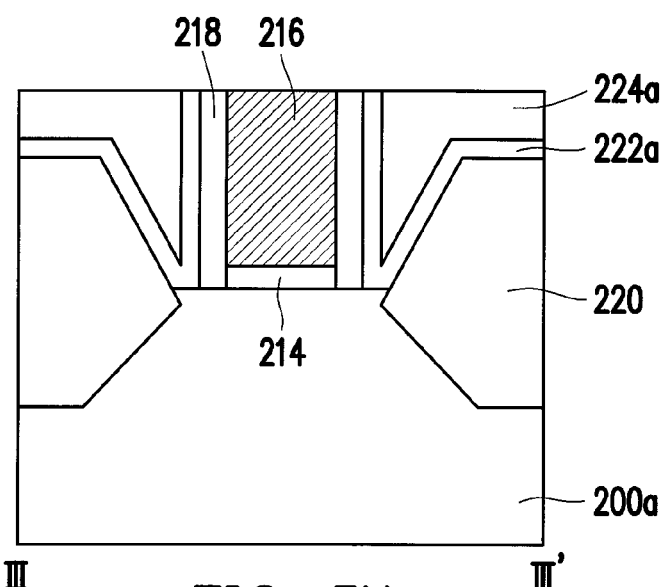
Figure 2L:
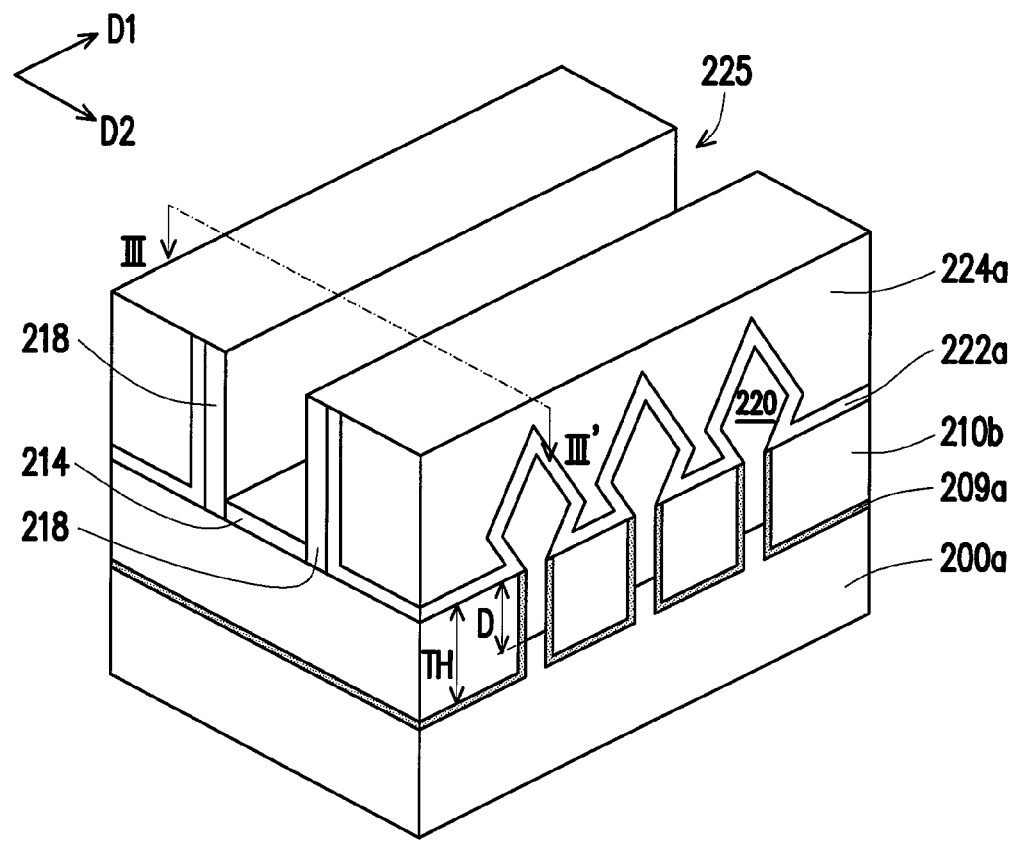
Figure 3L:
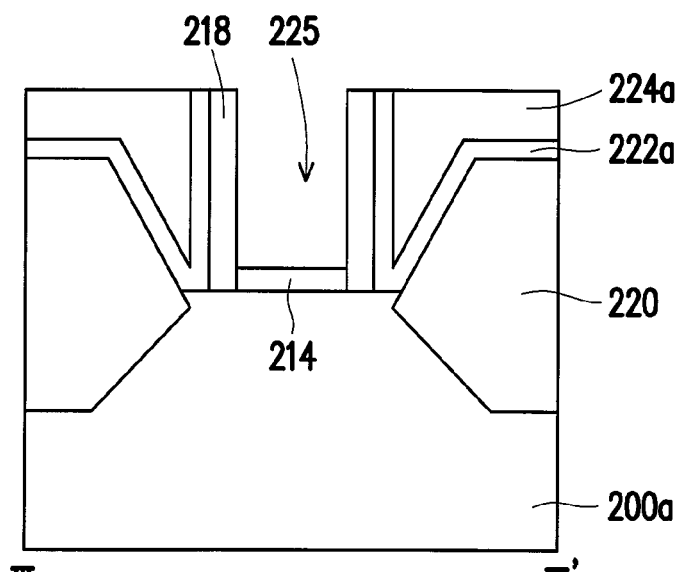
Figure 2M:
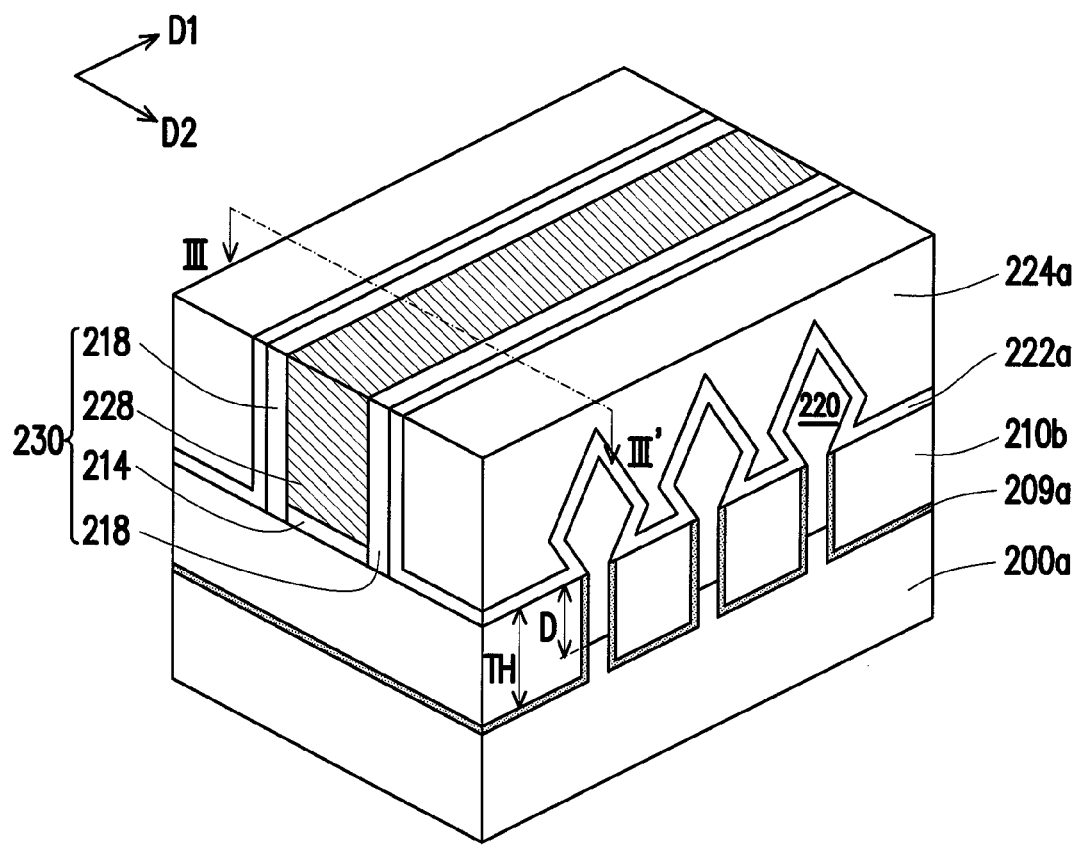
Figure 3M:
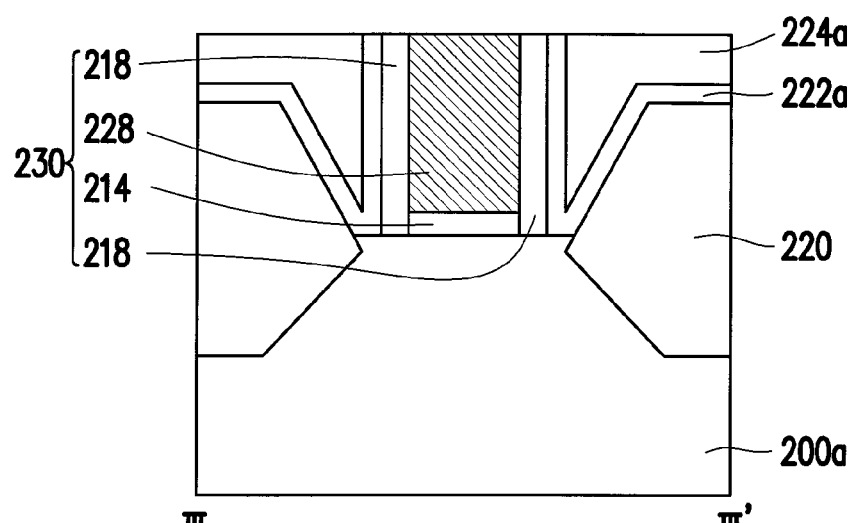

In Step S22 in FIG. 1, and as shown in FIGS. 2D to 2E and FIGS. 3D to 3E, a chemical mechanical polish process is, for example, performed to remove a portion of the insulating material 210, the blocking material layers 209, the patterned mask layer 203a and the patterned pad layer 202a until the semiconductor fins 208 are exposed. As shown in FIG. 2E and FIG. 3E, after the insulating material 210 is polished, top surfaces of a polished insulating material 210a and the blocking material layers 209 are substantially coplanar with top surface T2 of the semiconductor fins 208.

In Step S22 in FIG. 1 and as shown in FIGS. 2E to 2F and FIGS. 3E to 3F, the polished insulating material 210a filled in the trenches 206 and the blocking material layers 209 are partially removed by an etching process, such that isolation structures 210b and blocking layers 209a are formed on the substrate 200a. One of the isolation structures 210b and one of the blocking layers 209a are located between two adjacent semiconductor fins 208. In some embodiments, the etching process may be a wet etching process using hydrofluoric acid (HF) or a dry etching process. Top surfaces T1 of the isolation structures 210b and the blocking layers 209a are lower than the top surfaces T2 of the semiconductor fins 208. The semiconductor fins 208 protrude from the top surfaces T1 of the isolation structures 210b and the blocking layers 209a. The height difference between the top surfaces T2 of the fins 208 and the top surfaces T1 of the isolation structures 210b and the blocking layers 209a is H, and the height difference H ranges from about 15 nm to about 50 nm.

In Step S24 in FIG. 1 and as shown in FIGS. 2F to 2G and FIGS. 3F to 3G, a gate stack 212 is formed across portions of the semiconductor fins 208, portions of the isolation structures 210b, and portions of the blocking layers 209a. In one embodiment, an extending direction D1 of the gate stack 212 is, for example, perpendicular to an extension direction D2 of the semiconductor fins 208 so as to cover middle portions M (or referred as first portions, shown in FIG. 3G) of the semiconductor fins 208.

In some embodiments, a ratio of a top CD (TCD) of the middle portion M (or referred as first portion) of the semiconductor fin 208 to a middle CD (MCD) of the semiconductor fin 208 ranges from 0.6 to 0.95, and a bottom CD (BCD) of the middle portion M (or referred as first portion) of the semiconductor fin 208 to the middle CD (MCD) of the semiconductor fin 208 ranges from 1.2 to 2.5. In some embodiments, the middle CD (MCD) of the semiconductor fin 208 is the CD of the semiconductor fin 208 located at the level of the top surface T1 of the isolation structures 210b. The middle portions M may act as channels of a tri-gate FinFET. In some embodiments, the gate stack 212 includes a gate dielectric layer 214 and a gate electrode 216 located over the gate dielectric layer 214. The gate dielectric layer 214 is located over portions of the semiconductor fins 208, portions of the isolation structures 210b, and portions of the blocking layers 209a. In alternative embodiments, the gate stack 212 may further include an interfacial layer (IL) on the semiconductor fins 208. In other words, the gate dielectric layer 214 is formed between the IL and the gate electrode 216. In some embodiments, the IL includes a dielectric material, such as a silicon oxide layer or a silicon oxynitride layer. The IL is formed by performing a thermal oxidation process, a chemical vapor deposition (CVD) process, or an atomic layer deposition (ALD) process.

The gate dielectric layer 214 is formed to cover the middle portions M (or referred as first portions) of the semiconductor fins 208, portions of the isolation structures 210b, and portions of the blocking layers 209a. In other words, the gate dielectric layer 214 is on a top surface and upper sidewalls of the middle portions M (or referred as first portions) of the semiconductor fins 208, and the blocking layers 209a are located on lower sidewalls of the middle portions M (or referred as first portions) of the semiconductor fins 208. In some embodiments, the gate dielectric layer 214 includes silicon oxide, silicon nitride, silicon oxy-nitride, high-k dielectric materials, or a combination thereof. The high-k dielectric materials are generally dielectric materials with a dielectric constant greater than 4. The high-k dielectric materials include metal oxide. In some embodiments, examples of the metal oxide used as the high-k dielectric materials include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu, or a combination thereof. The gate dielectric layer 214 is formed by performing a thermal oxidation process, a CVD process, an ALD process, or a combination thereof.

The gate electrode 216 is formed on the gate dielectric layer 214. In some embodiments, the gate electrode 216 is a dummy gate. The dummy gate includes a polysilicon layer, an amorphous silicon layer or a combination thereof formed by performing a CVD process, for example. In alternative embodiments, the gate electrode 216 is a metal gate, and the gate electrode 216 includes a barrier, a work function layer, a seed layer, an adhesion layer, a barrier layer, or a combination thereof. The metal gate includes Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. In some embodiments, the gate electrode 216 includes metals suitable for a PMOS device, such as TiN, WN, TaN, or Ru. In some alternative embodiments, the gate electrode 216 includes metals suitable for an NMOS device, such as Ti, Ag, Al, TiAl, TiAlN, TaC, TaCN, TaSiN, Mn, or Zr. The gate electrode 216 may be formed by performing a suitable process such as ALD, CVD, PVD, plating, or a combination thereof.

In addition, the gate stack 212 may further include a pair of spacers 218 located on sidewalls of the gate dielectric layer 214 and the gate electrode 216. The pair of spacers 218 may further cover portions of the semiconductor fins 208. The spacers 218 are formed of dielectric materials, such as silicon oxide, silicon nitride, SiCON or a combination thereof. The spacers 218 may include a single layer or multilayer structure. Portions of the semiconductor fins 208 that are not covered by the gate stack 212 are referred to as exposed portions E hereinafter.

In Step S26 in FIG. 1 and as shown in FIGS. 2G to 2H and FIGS. 3G to 3H, the exposed portions E of the semiconductor fins 208 are removed and recessed to form recessed portions R (or referred as second portions). For example, the exposed portions E are removed by performing an anisotropic etching process, an isotropic etching process or a combination thereof. In some embodiments, the exposed portions E of the semiconductor fins 208 are recessed below the top surfaces T1 of the isolation structures 210b. A depth D of the recessed portions R is less than a thickness TH of the isolation structures 210b. Portions of the semiconductor fins 208 covered by the gate stack 212 are not removed when the exposed portions E of the semiconductor fins 208 are recessed. Therefore, the height of the middle portions M (or referred as the first portions) is greater than the height of the recessed portions R (or referred as the second portions). The portions of the semiconductor fins 208 covered by the gate stack 212 are exposed at sidewalls of the gate stack 212. Portions of the blocking layers 209a are located on sidewalls of the recessed portions R (or referred as second portions) of the semiconductor fins 208, and another portions of the blocking layers 209a not covered by the gate stack 212 are exposed by the recessed portions R.

In Step S28 in FIG. 1 and as shown in FIGS. 2H to 2I and FIGS. 3H to 3I, strained layers 220 are selectively grown over the recessed portions R of the semiconductor fins 208 and extend beyond the top surfaces T1 of the isolation structures 210b to strain or stress the semiconductor fins 208. The strained layers 214 include sources located at a side of the stack gate 212 and drains located at the other side of the gate stack 212. The sources cover an end of the semiconductor fins 208 and the drains cover the other end of the semiconductor fin 208. The lattice constant of the strained layers 214 are different from the lattice constant of the substrate 200a, the portions of the semiconductor fins 208 covered by the gate stack 212 are strained or stressed to enhance carrier mobility and performance of the FinFET. In one embodiment, the strained layers 214 such as silicon carbon (SiC), are epitaxial-grown by a LPCVD process to form the sources and drains of the n-type FinFET. In another embodiment, the strained layers 214, such as silicon germanium (SiGe), is epitaxial-grown by a LPCVD process to form the sources and drains of the p-type FinFET. After the strained layers 220 are formed, the blocking layers 209a not covered by the gate stack 212 are located between the recessed portions R (or referred as second portions) of the semiconductor fins 208 and the isolation structures 210b, and between the strained layers 220 and the isolation structures.

In Step S30 in FIG. 1 and as shown in FIGS. 2I to 2J and FIGS. 3I to 3J, an etch stop layer 222 is formed over the substrate 200a. In some embodiments, the etch stop layer 222 is conformally formed to overlay sidewalls and the top surface of the gate stack 212, the isolation structures 210b, the blocking layers 209a and the strained layers 214. In some embodiment, the etch stop layer 222 is a contact etch stop layer (CESL). The etch stop layer 222 includes silicon nitride or carbon-doped silicon nitride, for example. In some embodiments, the etch stop layer 222 is deposited by performing a CVD process, a HDPCVD process, a SACVD process, a molecular layer deposition (MLD) process, or other suitable processes. In some embodiments, before the etch stop layer 222 is formed, a buffer layer (not shown) may be further formed over the substrate 200a. In an embodiment, the buffer layer is an oxide such as silicon oxide. However, other compositions may be used as well. In some embodiments, the buffer layer is deposited using by performing a CVD process, a HDPCVD process, a SACVD process, a MLD process, or other suitable processes.

In Step S30 in FIG. 1 and as shown in FIGS. 2I to 2J and FIGS. 3I to 3J, a dielectric layer 224 is formed over the etch stop layer 222 and aside the gate stack 212. The dielectric layer 224 includes a dielectric material. The dielectric material includes silicon oxide, silicon nitride, silicon oxynitride, phosphosilicate glass (PSG), borophosphosilicate glass (BPSG), spin-on glass (SOG), fluorinated silica glass (FSG), carbon doped silicon oxide (e.g., SiCOH), polyimide, and/or a combination thereof. In some other embodiments, the dielectric layer 224 includes low-k dielectric materials. It should be noted that the low-k dielectric materials are generally dielectric materials having a dielectric constant lower than 3.9. Examples of low-k dielectric materials includes BLACK DIAMOND® (Applied Materials of Santa Clara, Calif.), Xerogel, Aerogel, amorphous fluorinated carbon, Parylene, BCB (bis-benzocyclobutenes), Flare, SILK® (Dow Chemical, Midland, Mich.), hydrogen silsesquioxane (HSQ) or fluorinated silicon oxide (SiOF), and/or a combination thereof. It is understood that the dielectric layer 224 may include one or more dielectric materials and/or one or more dielectric layers. In some embodiments, the dielectric layer 224 is deposited to a suitable thickness by performing a CVD process, a HDPCVD process, a SACVD process, a spin-on process, or other suitable processes.

In Step S32 in FIG. 1 and as shown in FIGS. 2J to 2K and FIGS. 3J to 3K, the dielectric layer 224 and the etch stop layer 222 are partially removed such that a top surface of the gate stack 212 is exposed, and a dielectric layer 224a and an etch stop layer 222a are remained. The process of removing the portion of the dielectric layer 224 and the portion of the etch stop layer 222 includes performing a chemical mechanical polishing (CMP) process, an etching process, or other suitable process. In some embodiment, after the dielectric layer 224 and the etch stop layer 222 are polished, top surfaces of the dielectric layer 224a and the etch stop layer 222a are substantially coplanar with top surface of the stack structure 212.

In Step S34 in FIG. 1 and as shown in FIGS. 2K to 2M and FIGS. 3K to 3M, when the gate electrode 216 is a dummy gate, a gate replacement process is performed. In the gate replacement process, the gate electrode 216 is removed to form a gate trench 225, and then a gate electrode 228 is filled into the gate trench 225. The gate electrode 216 is removed by anisotropic etching, isotropic etching or a combination thereof, for example. The gate electrode 228 includes a metal gate. The metal gate includes Al, Cu, W, Ti, Ta, Ag, Ru, Mn, Zr, TiAl, TiN, TaN, WN, TiAlN, TaN, TaC, TaCN, TaSiN, NiSi, CoSi, or a combination thereof, for example. The gate electrode 228 may include a barrier, a work function layer, a seed layer, an adhesion layer, a barrier layer, or a combination thereof. In some embodiments, the gate electrode 228 includes metals suitable for a PMOS device, such as TiN, WN, TaN, or Ru. In some alternative embodiments, the gate electrode 228 includes metals for an NMOS device, such as Ti, Ag, Al, TiAl, TiAlN, TaC, TaCN, TaSiN, Mn, or Zr for an NMOS device. In some embodiments, after the gate replacement process is performed, a gate stack 230 is formed. The gate stack 230 includes the gate dielectric layer 214, and the gate electrode 228 located over the gate dielectric layer 214. The gate stack 230 may further include the pair of spacers 218 located on the sidewalls of the gate dielectric layer 214 and the gate electrode 228.

In the disclosure, the blocking material layers are formed on the sidewalls of the semiconductor fins to prevent the semiconductor fins from being oxidized or etched during the subsequent anneal process, etching process (such as a dry etching or wet etching) or cleaning process after the isolation structures are formed. Therefore, the critical dimension (CD) of the semiconductor fins may be prevented from being reduced. Thus, the ratio between the top CD and the bottom CD of the semiconductor fin is higher, and the performance of the device is increased. Moreover, in some embodiments, the blocking material layers include oxygen-rich semiconductor oxide or negative-charged layers, so as to reduce the phenomenon of charge trapping, provide a preferable surface protection, and reduce a current leakage. Moreover, as the blocking material layers may include oxygen-rich semiconductor oxide or negative-charged layers, the distance of trapping to the semiconductor fins is smaller. Consequently, the random telegraph signal (RTS) of the device is improved.

In accordance with some embodiments of the present disclosure, a fin field effect transistor (FinFET) includes a substrate, a plurality of isolation structures, a plurality of blocking layers, and a gate stack. The substrate has a plurality of semiconductor fins. The isolation structures are located on the substrate to isolate the semiconductor fins. In addition, the semiconductor fins protrude from the isolation structures. The blocking layers are located between the isolation structures and the semiconductor fins. The material of the blocking layers is different from the material of the isolation structures. The gate stack is disposed across portions of the semiconductor fins, portions of the blocking layers and portions of the isolation structures.

In accordance with alternative embodiments of the present disclosure, a fin field effect transistor (FinFET) includes a substrate, a gate dielectric layer, a gate electrode, a plurality of blocking layers, a plurality of strained layers, and a plurality of isolation structures. The substrate has a semiconductor fin. The semiconductor fin includes a first portion and a plurality of second portions, the first portion is disposed between the second portions. The gate dielectric layer is disposed on a top surface and upper sidewalls of the first portion of the semiconductor fin. The gate electrode is disposed on the gate dielectric layer. The blocking layers are disposed on lower sidewalls of the first portion of the semiconductor fin, and on sidewalls of the second portions of the semiconductor fin. The strained layers are disposed over the second portions of the semiconductor fin. The isolation structures are disposed aside the blocking layers. The material of the blocking layers is different from the material of the isolation structures.

In accordance with yet alternative embodiments of the present disclosure, a method for fabricating a fin field effect transistor (FinFET) includes steps as follows. First, a substrate is provided. Then, a portion of the substrate is removed to form a plurality of trenches in the substrate and semiconductor fins between the trenches. A plurality of blocking material layers are formed at sidewalls of the semiconductor fins. An isolation material is formed over the substrate to cover the blocking material layers and fill in the trenches. In addition, the material of the blocking material layers is different from the material of the isolation material. Then, the isolation material and the blocking material layers are partially removed to form a plurality of isolation structures and a plurality of blocking layers. The semiconductor fins protrude from the isolation structures. Subsequently, a gate stack is formed across the semiconductor fins, the blocking layers and the isolation structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A fin field effect transistor (FinFET), comprising:
a substrate having a plurality of semiconductor fins;
a plurality of isolation structures on the substrate to isolate the semiconductor fins, wherein the semiconductor fins protrude from the isolation structures;
a plurality of blocking layers located between the isolation structures and the semiconductor fins, and between the isolation structures and the substrate, wherein a material of the blocking layers is different from a material of the isolation structures, wherein the blocking layers comprise an oxygen-rich oxide; and
a gate stack across portions of the semiconductor fins, portions of the blocking layers and portions of the isolation structures.

2. The FinFET of claim 1, wherein a content of oxygen of the blocking layers is larger than a content of oxygen of the isolation structures.

3. The FinFET of claim 1, wherein the oxygen-rich oxide is represented by $MO_x$, where M is Si or Ge, and $2.1 \le x \le 2.5$.

4. The FinFET of claim 3, wherein a material of the isolation structures is represented by $SiO_y$, and $y \le 2.0$.

5. The FinFET of claim 1, wherein the blocking layers comprise negative-charged layers, and the isolation structures comprise positive charged layers.

6. A fin field effect transistor (FinFET), comprising:
a substrate having a semiconductor fin, wherein the semiconductor fin comprises a first portion and a plurality of second portions, the first portion is disposed between the second portions;
a gate dielectric layer on a top surface and upper sidewalls of the first portion of the semiconductor fin;
a gate electrode on the gate dielectric layer;
a plurality of blocking layers on lower sidewalls of the first portion of the semiconductor fin, on sidewalls of the second portions of the semiconductor fin, and on a top surface of the substrate, wherein the blocking layers comprise an oxygen-rich oxide;
a plurality of strained layers over the second portions of the semiconductor fin; and
a plurality of isolation structures on the blocking layers, wherein a material of the blocking layers is different from a material of the isolation structures.

7. The FinFET of claim 6, wherein the oxygen-rich oxide is represented by $MO_x$, where M is Si or Ge, and $2.1 \le x \le 2.5$.

8. The FinFET of claim 6, wherein the blocking layers comprise negative-charged layers.

9. The FinFET of claim 8, wherein a surface charge of the negative-charged layers ranges from $-20 \times 10^{10}/cm^2$ to $-150 \times 10^{10}/cm^2$.

10. The FinFET of claim 6, wherein a height of the second portions of the semiconductor fin is less than a height of the first portion of the semiconductor fin.

11. The FinFET of claim 6, wherein the blocking layers are located between the semiconductor fin and the isolation structures, and between the strained layers and the isolation structures.

12. A method for fabricating a fin field effect transistor (FinFET), comprising:
providing a substrate;
removing a portion of the substrate to form a plurality of trenches in the substrate and semiconductor fins between the trenches;
forming a plurality of blocking material layers at sidewalls of the semiconductor fins and on bottom surfaces of the trenches;
forming an isolation material over the substrate to cover the blocking material layers and fill in the trenches, wherein a material of the blocking material layers is different from a material of the isolation material;
partially removing the isolation material and the blocking material layers to form a plurality of isolation structures and a plurality of blocking layers, wherein the semiconductor fins protrude from the isolation structures, wherein the blocking layers comprise an oxygen-rich oxide; and
forming a gate stack across the semiconductor fins, the blocking layers and the isolation structures.

13. The method of claim 12, wherein the step of forming the plurality of blocking layers comprises performing an oxidation process.

14. The method of claim 12, wherein the step of forming the plurality of blocking layers comprises performing a plasma treatment.

15. The method of claim 12, wherein the blocking layers comprise negative-charged layers.

16. The method of claim 12, further comprising performing an annealing process before the step of partially removing the isolation material and the blocking material layers.

17. The method of claim 12 further comprising:
removing top portions of the semiconductor fins exposed by the gate stack to form a plurality of recessed portions of the semiconductor fins; and
forming a plurality of strained layers over the recessed portions of the semiconductor fins.

* * * * *